United States Patent
Thurgate et al.

(10) Patent No.: US 7,009,271 B1
(45) Date of Patent: Mar. 7, 2006

(54) MEMORY DEVICE WITH AN ALTERNATING VSS INTERCONNECTION

(75) Inventors: Timothy Thurgate, Sunnyvale, CA (US); Richard Fastow, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 34 days.

(21) Appl. No.: 10/823,972

(22) Filed: Apr. 13, 2004

(51) Int. Cl.
*H01L 29/00* (2006.01)

(52) U.S. Cl. ............... 257/510; 257/374; 257/396; 257/397; 257/519; 257/647; 257/548

(58) Field of Classification Search ............... None
See application file for complete search history.

(56) References Cited

U.S. PATENT DOCUMENTS 6,017,796 A * 1/2000 Chen et al. ............... 438/264
6,388,304 B1 * 5/2002 Matsuoka et al. .......... 257/510

* cited by examiner

Primary Examiner—Andy Huynh

(57) ABSTRACT

A semiconductor memory device provides non-volatile memory with a memory array having an alternating Vss interconnection. Using the alternating Vss interconnection, a low implant dosage is added to a region proximate to the lower areas of an STI region, such as beneath the STI region, to ameliorate the problem of low Vss conductivity by providing an adequate number of multiple current paths over several Vss lines. However, non-adjacent STI regions, rather than adjacent STI region, receive the implant. Alternating Vss lines are interconnected by thus implanting under every other STI region. This alternating Vss interconnection imparts an adequately high Vss conductivity, yet without diffusion areas merging to isolate the associated memory device or contaminating the drains and maintains scalability.

17 Claims, 10 Drawing Sheets

MEMORY DEVICE WITH AN ALTERNATING VSS INTERCONNECTION

TECHNICAL FIELD

The present invention relates to the field of semiconductor memory devices. Specifically, the present invention relates to a nonvolatile semiconductor memory device including a NOR type array of flash memory cells exhibiting straight word lines.

BACKGROUND

A flash or block erase memory (flash memory), such as, Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block.

A memory of this type includes individual Metal Oxide Semiconductor (MOS) memory cells that are field effect transistors (FETs). Each FET flash memory cell includes a source, drain, floating gate and control gate to which various voltages are applied to program the cell with a binary 1 or 0, or erase all of the cells as a block. Flash memory cells effectuate nonvolatile data storage.

Programming, which sets the logical value of a cell to '0', occurs by hot electron injection to the floating gate at about 5–7 Volts. Erasing, which sets the logical value of the cell to "1," employs Fowler-Nordheim tunneling. Erasure occurs as electrons tunnel through a thin tunnel dielectric layer, by which the charge on the floating gate is reduced. Erasure is driven at about 8–11 Volts.

Prior Art FIG. 1A (not drawn to scale) illustrates a top view of a typical configuration of a plan view of a section of a memory array 100 in a NOR-type of configuration for a memory device. Array 100 is comprised of rows 110 and columns 120 of memory cells. Each of the memory cells are insulated from other memory cells by shallow trench isolation (STI) regions 150.

Effectively, word lines form the gates of the memory cell devices. The control gates of each of the memory cells are coupled together in each of the rows 110 of memory cells, and form word lines 130 that extend along the row direction. Bit lines extend in the column direction and are coupled to drain regions via drain contacts 160 in an associated column of memory cells 120. The bit lines are coupled to drain regions of memory cells in associated columns of memory cells 120.

Source (Vss) lines 140 extend in the row direction and are coupled to the source regions of each of the memory cells in the array of memory cells 100. One Vss line is coupled to source regions in adjoining rows of memory cells, and as a result, one source region is shared between two memory cells. Similarly, drain regions are shared amongst adjoining rows of memory cells, and as a result, one drain region is shared between two memory cells.

Source contacts 145 are coupled to the common Vss lines 140, typically at each 16th device. Each of the source contacts 145 is formed in line with the associated common Vss line to which it is coupled. The source contacts are formed in a column 160, and may be connected with each other. The column 160 is isolated between two STI regions and forms a dead zone in which no memory cells are present.

Vss lines 140 are formed from silicon (Si) substrate by the diffusion of dopants and are thus semiconductors. These semiconducting Vss lines are less conductive than the metal lines used to interconnect drains. With source contacts at, for example, every sixteenth device, current conducted via the relatively resistive Vss lines causes a voltage (e.g., IR) drop between the source contacts and the sources of the individual devices.

Where the Vss IR drop is significant, relatively low Vss conductivity can be problematic. To prevent significant Vss IR drop, conventional Vss lines are made with a heavy implant of dopants, so as to assure sufficient conductivity. However, this conventional solution can also be problematic. The heavy implants needed to make Vss lines of relatively high conductivity can lead to device and scaling problems.

To make Vss lines of sufficient conductivity to minimize IR drop conventionally, the implant dosages used can be high enough for diffusion of implants into the device to occur. Diffusion into the device can adversely affect the performance of the device. Inadequate device performance can correspondingly deleteriously impact the functionality of the memory array. Diffusion into the device can also limit scalability.

One technique for maintaining adequate Vss conductivity is to interconnect Vss lines, thus providing multiple source current paths. Vss lines can be interconnected by implants beneath the adjacent STI regions. The implant must be performed early in the fabrication process, while the STI regions are open, resulting in significant diffusion after the implant.

During further processing however, the regions of diffusion in substrate beneath and between STI in the vicinity of the Vss interconnections can merge, as shown in Prior Art FIG. 1B. This merger 105 of diffusion regions is problematic because it can lead to isolation of the devices from substrate 101. A further problem with this technique is that it can be difficult to maintain the requisite isolation of the drain areas from the Vss implant diffusion.

Although vertical and horizontal reference measurement scales are shown in Prior Art FIG. 1B, the measurements are illustrative only. Implants (e.g., regions of high dopant concentration) 105 are added beneath STI 150, so as to raise the conductivity of Vss lines by interconnecting them.

As shown in Prior Art FIG. 1B, diffusion region 105 effectively interconnects implants 104 under each of the STI regions 150. Problematically, diffusion region 105 isolates device 103. Further, the top of diffusion region 105 is close to drain junction 103. It is possible that the drain will punch through to the diffusion region 105 at moderate voltages.

Diffusion effects associated with implants beneath adjacent STI areas can be severe enough to impact the scalability of the device. A high degree of scalability is desirable for simultaneously increasing performance and decreasing size. The diffusion of the dopants used to raise Vss conductivity however effectively contaminates the channel of the device, isolates devices, and even where controlled, can problematically prevent further scaling.

Conventional amelioration of Vss IR drop by using heavy implants is problematic because associated diffusion affects device performance, which can harm the functionality of the memory array. Further, the diffusion associated with Vss implants under adjacent STI regions can isolate devices and delimit the ability to scale. Such limitations on scaling adversely impact functionality and further miniaturization.

SUMMARY

A semiconductor memory device having a memory array in which Vss lines have sufficient conductivity to minimize related voltage drops, without diffusion related problems adversely affecting device performance is disclosed. An embodiment of the present invention interconnects Vss lines using an alternating Vss interconnection, wherein interconnect implants are added beneath non-adjacent STI lines. The alternating Vss interconnection provides adequate Vss conductivity without device isolation associated with implant diffusion. In the present embodiment, drains remain safely isolated from the Vss implants. The foregoing advantages are achieved with no adverse impact on scalability.

BRIEF DESCRIPTION OF THE DRAWINGS

Prior Art

Prior Art

FIGS. 1–9 are drawn for illustrative purposes only and are not necessarily drawn to scale. Where scales are used, they are exemplary only.

DETAILED DESCRIPTION

Reference will now be made in detail to an embodiment of the present invention, a semiconductor memory device having an alternating Vss interconnection, and a method for producing the same. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

For instance, one embodiment of the present invention, a memory device with an alternating Vss connection, is explained herein by reference to an exemplary memory structure having straight wordlines (e.g., FIGS. 2–5 herein). However, it is appreciated that an embodiment of the present invention comprises a memory device with an alternating Vss connection that is applied to memory devices arrayed in another configuration, for example, with word lines that are not straight. Embodiments of the present invention, a memory device with an alternating Vss connection, are well suited to be applied to memory devices having a variety of configurations.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses a memory device having an alternating Vss interconnection which provides adequate Vss conductivity, while advantageously preventing excessive diffusion that could adversely affect device performance. Also, the present invention discloses a method for forming a memory device having an alternating Vss interconnection, which provides the foregoing advantages without adversely impacting scalability. In one embodiment, the memory is non-volatile.

Exemplary Memory Structure

One embodiment of the present invention, a memory device with an alternating Vss connection, is explained herein by reference to an exemplary memory structure having straight wordlines (e.g., FIGS. 2–5 herein). However, it is appreciated that another embodiment of the present invention comprises a memory device with an alternating Vss connection that is applied to memory devices arrayed in another configuration, for example, with word lines that are not straight. Embodiments of the present invention, a memory device with an alternating Vss connection, are well suited to be applied to memory devices having a variety of configurations.

Figure 2:
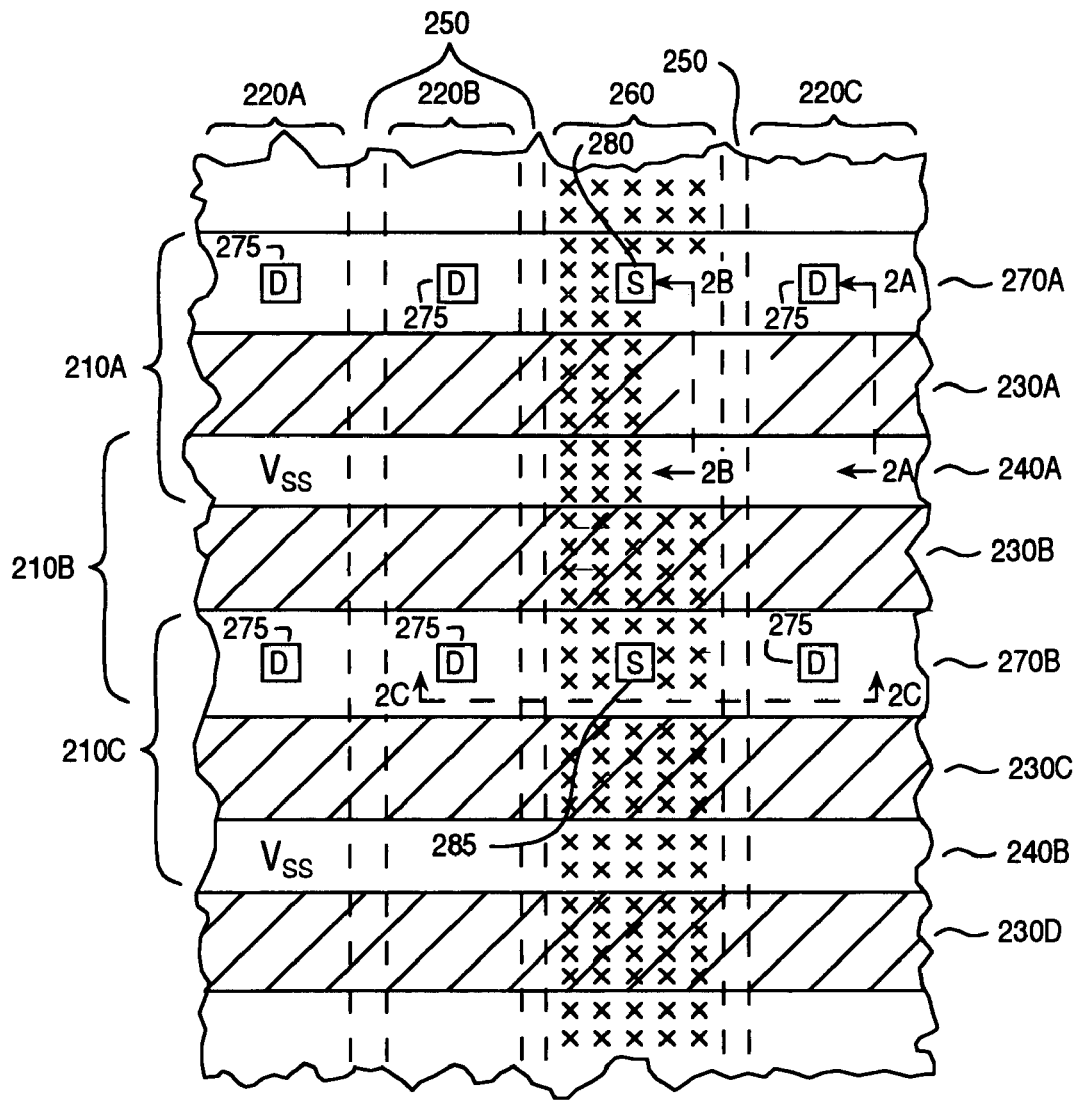
FIG. 2 is a planar view of a section of a core memory array of memory cells, according to one embodiment of the present invention.

FIG. 2 depicts a planar view of a section of the core array of memory cells upon which an embodiment of the present invention can be applied. Array 200 comprises rows 210 of memory cells (e.g., row 210A, 210B, 210C, etc.). The array 200 also comprises columns 220 of memory cells (e.g., column 220A, 220B, 220C, etc.). Each of the memory cells are isolated from other memory cells by insulating layers. For instance, non-intersecting shallow trench isolation regions (STI) 250 isolate memory cells along the row direction, and word lines 230 isolate memory cells in the column direction.

The control gates of each of the memory cells in the array 200 are coupled together in each of the rows 210 of memory cells, and form word lines 230 (e.g., 230A, 230B, 230C, 230D, etc.) that extend along the row direction, in accordance with one embodiment of the present invention. In another embodiment, the plurality of word lines 230 may be formed on top of the control gates of each of the memory cells in the array 200.

Bit lines (not shown) extend in the column direction and are coupled to drain regions of associated memory cells via drain contacts 275 in associated columns of memory cells 220. As such, each of the bit lines are coupled to drain regions of memory cells in associated columns of memory cells 220.

Source lines 240 (e.g., 240A, 240B, etc.), known as Vss lines, extend along the row direction and are coupled to source regions in each of the memory cells in the array of memory cells 200. In one embodiment, Vss lines 240 are common source lines. As such, each of the Vss source lines 240 are electrically coupled together.

In addition, one common source line is coupled to source regions in adjoining rows of memory cells, and as a result, one source region is shared between two memory cells. Similarly, drain regions are shared amongst adjoining rows of memory cells, and as a result, one drain region is shared between two memory cells in the column direction.

Also, as shown in FIG. 2, each of the rows of memory cells 210 has an associated row of drain contacts 270 in the rows of drain contacts (comprised of rows 270A, 270B, etc.). For example, row 210A is associated with the row 270A of drain contacts. Within the fabrication process, each of the drain contacts 275 are formed similarly and simultaneously to couple with the underlying drain regions of each of the memory cells in the array 200.

FIG. 2 is exemplary only, and the pattern of word lines, source lines, and bit lines can be altered for performance reasons. For example, each of the Vss lines 240 of FIG. 2 is a common source line, but could easily be formed as an unshared source line. In addition, the pattern of word lines, source lines, and bit lines coupled to the array of memory cells 200 is shown in a NOR type configuration. However, other embodiments are well suited to arrays of other logical configurations.

FIG. 2 illustrates the formation of a source column 260 for providing electrical coupling to the source regions of each of the memory cells in the array 200, in accordance with one embodiment of the present invention. The source column 260 is implanted with n-type dopants, in general. In one embodiment, n-type dopants can be selected from a group consisting of antimony (Sb), arsenic (As), and phosphorous (P). However, other embodiments are well suited to any n-type dopants suitable for fabrication of core array of memory cells. As shown in FIG. 2, the source column 260 is formed perpendicular to each of the plurality of rows of memory cells 210, and in particular, to each of the Vss lines 240.

Source column 260 is isolated between an adjoining pair 250A of the non-intersecting STI regions 250. As such, the source column 260 is electrically isolated from adjoining memory cells on either side of the adjoining pair 250A of STI regions. The source column 260 is also permanently coupled to several Vss lines 240. As previously discussed, the Vss lines 240 are coupled to source regions in the array 200. As such, each of the source regions in the array 200 are electrically coupled to each other through the plurality of Vss lines 240 and the source column 260.

FIG. 2 also depicts the formation of a source contact 280 that is coupled to the source column 260. The source contact 280 provides for electrical coupling with each of the source regions in memory cells of the array 200 through the source column and Vss lines 240.

In one embodiment, the source contact is located along one of the rows 270 of drain contacts (e.g., row 270A). As such, the source contact 280 is formed similarly and simultaneously in the fabrication process as the drain contacts 275 in the row 270A. In one embodiment, the source contact 280 is of the same size and dimension as the drain contacts 275 in the associated row of drain contacts 270A. The source contact 280 provides for electrical coupling to the source column 260, and as such, to each of the source regions of memory cells in the array 200. In another embodiment, the source contact is of a different dimension than an associated row of drain contacts.

In another embodiment, a second source contact 285 is formed to couple with the source column 260. By strapping the source column 260 with a second source contact 285, the conductivity of the Vss lines 240 is reduced. The second source contact 285 is formed in a second row of drain contacts 270B that are coupled to drain regions of a second row of memory cells. In another embodiment, each of the rows of drain contacts 270 that is associated with the rows of memory cells 210 has a source contact formed in the source column 260.

In one embodiment, the location of the source contact 280 along the row of drain contacts 270 enables the straight formation of a word line (e.g., 230A) that intersects the source column 260 near to the source contact 280. In the present embodiment, instead of forming the source contact 280 in line with an associated Vss line (e.g., 240A) from the plurality of common source lines 240, the source contact is moved and formed along one of the plurality of rows of drain contacts 270 (e.g., row 270A). The drain contacts 270 of in each of the rows of memory cells 210 are arranged perpendicularly to the source column 260.

Since there is more space allowed to form the source contact (e.g., 280) along the row of drain contacts 270A than in one of the plurality of common source lines 240, the plurality of word lines 230 do not need to be adjusted, or bent, through photolithography techniques in order to accommodate for the source contact 280. As such, the word lines (e.g., word line 230A) that intersects the source column 260 on either side of the row of drain contacts 270A that includes the source contact 280 will maintain a uniform and straight formation in the fabrication process.

Figure 1A:
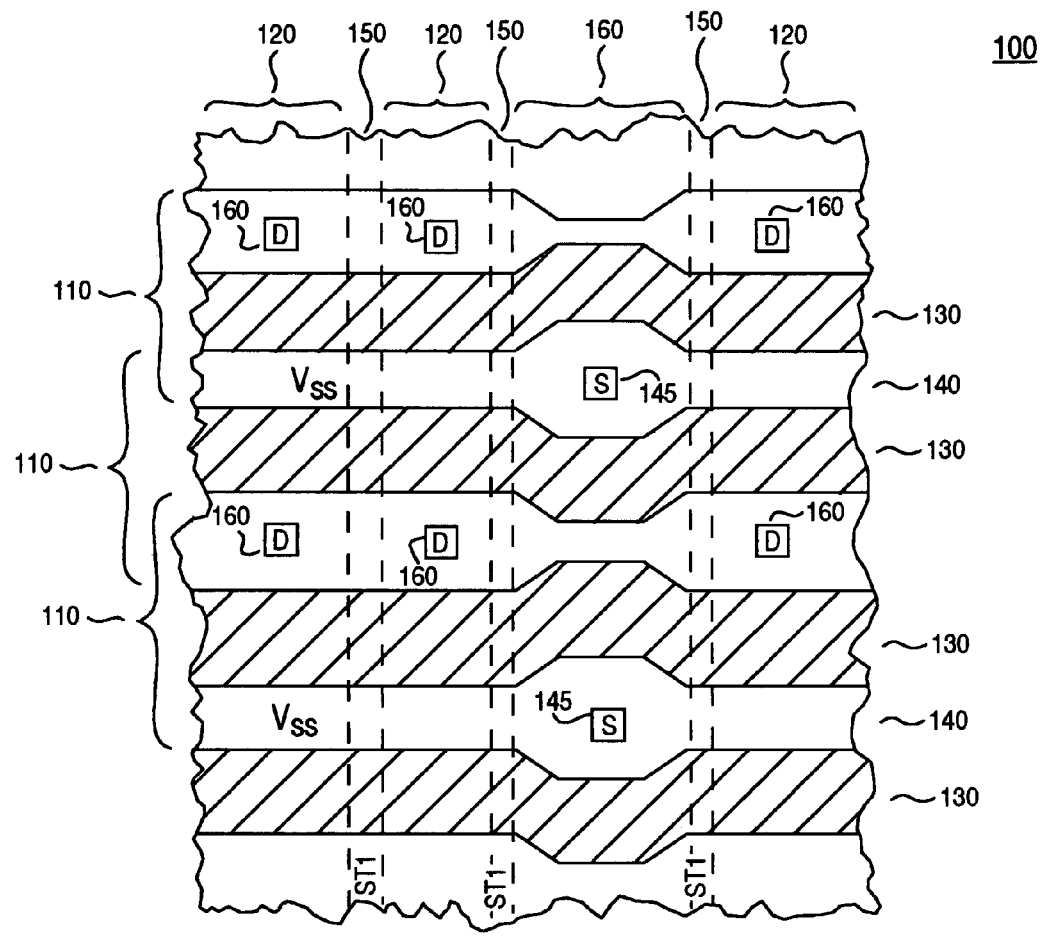
FIG. 1A is a planar view of a section of a core memory array of memory cells in a typical semiconductor memory.
Figure 1B:
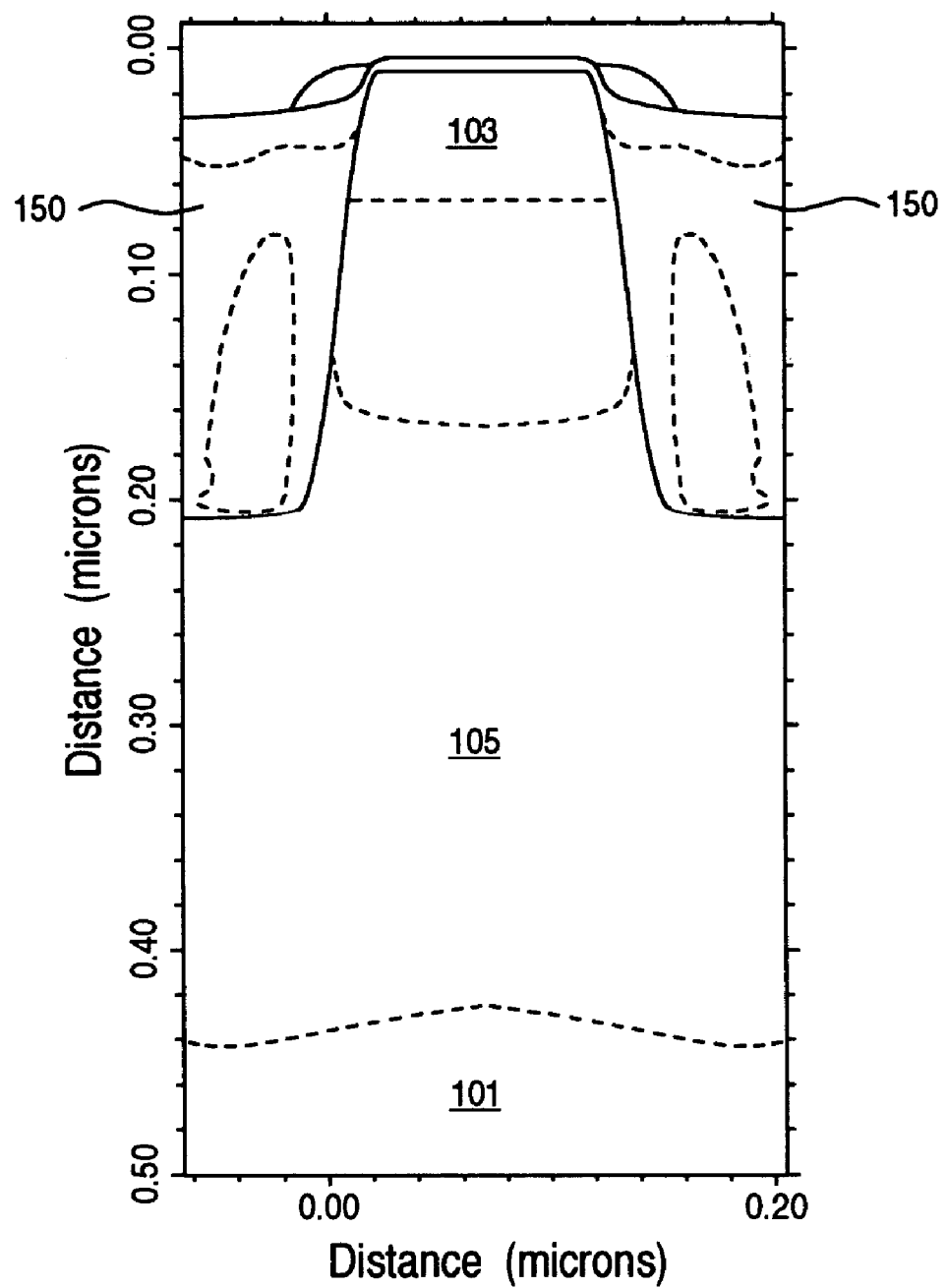
FIG. 1B is a cross sectional view of a section of a core memory array of memory cells including a drain junction and two implant beneath adjacent STI areas, in which regions of implant diffusion therefrom have merged.

Similarly, by forming source contacts (e.g., 280 and 285) in each of the plurality of rows of drain contacts 270, each of the plurality of word lines 240 that intersects the source column 260 near one of the plurality of source contacts can maintain a uniform and straight formation in the fabrication process. In addition, by locating the source contacts in drain contacts 270, each of the rows of memory cells 210 is smaller than each of the plurality of rows of memory cells 110 of Prior Art FIG. 1. By locating the plurality of source contacts (e.g., 280 and 285) in the plurality of rows 270, the word lines do not require any bending.

In another embodiment, a second source column (not shown) is also implanted with n-type dopants and isolated between a second adjoining pair of the plurality of non-intersecting STI regions 250. The second source column is also coupled to the common Vss lines 240. In addition, source contacts are formed in the second source column similarly in the plurality of rows of drain contacts 270, as previously discussed. The second source column is located x columns of memory cells from the source column 260 as shown in FIG. 2 for improving conductivity in the common Vss lines 240. The number 'x' in the present embodiment is any number between 15 and 35. In another embodiment, 'x' is another number.

Figure 3:
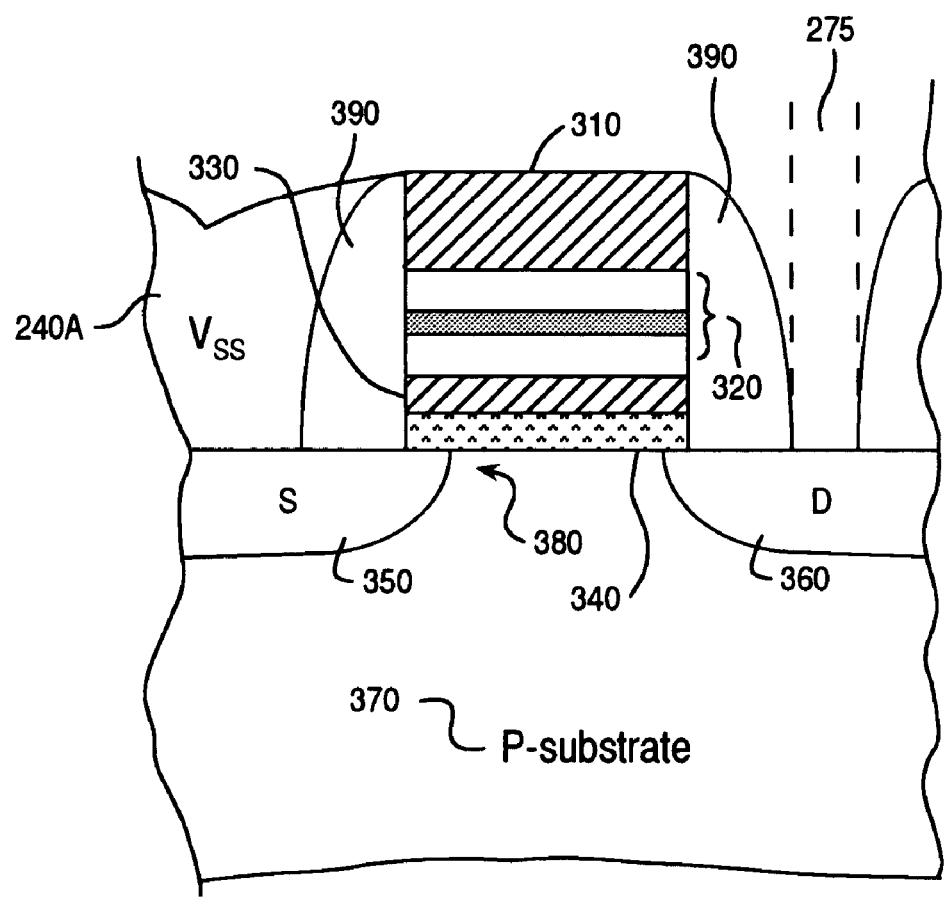
FIG. 3 is a cross sectional view of the core memory array of memory cells (e.g., of FIG. 2 taken along line 2A—2A) illustrating an exemplary semiconductor flash memory cell, in accordance with one embodiment of the present invention.

FIG. 3 is a cross sectional diagram of the array of memory cells 200 taken along line 2A—2A of FIG. 2, in accordance with one embodiment of the present invention. FIG. 3 illustrates the formation of flash memory cell in one embodiment; however, other embodiments can include the formation of additional types of memory cells. FIG. 3 is a cross-sectional diagram of flash memory cell 300 including a tunnel oxide dielectric 340. The tunnel oxide dielectric 340 is sandwiched between a conducting polysilicon (POLY) floating gate 330 and a crystalline silicon semiconductor substrate 370 (e.g., a p-substrate). The substrate 370 includes a source region 350 and a drain region 360 that can be separated by an underlying channel region 380. A control gate 310 is provided adjacent to the floating gate 330, and is separated by an interpoly dielectric 320. Typically, the interpoly dielectric 320 can be composed of an oxide-nitride-oxide (ONO) structure. In one embodiment, the control gate 310 forms the word line 230A of FIG. 2.

The flash memory cell 300 can be adapted to form a p-channel flash memory cell or an n-channel flash memory cell depending on user preference, in accordance with embodiments of the present invention. Embodiments of the present inventions are well suited to implementation within a p-channel or n-channel flash memory cell. Appropriate changes in the FIGS. 2–5 are necessary to reflect implementation of p-channel or n-channel devices.

FIG. 3 also illustrates optional sidewall spacers 375 formed on either side of the flash memory cell 300 for insulating the stacked gate formation of the flash memory cell 300. FIG. 3 also illustrates the formation of the common Vss 240A that is coupled to the source region 350 of the flash memory cell 300. The Vss line 240A as shown in FIG. 3 is permanently coupled to a source column (e.g., source column 260 of FIG. 2). In addition, a drain contact 275 is shown that is one of an associated row of drain contacts 270A in an row 210A of memory cells that includes flash memory cell 300.

Figure 4:
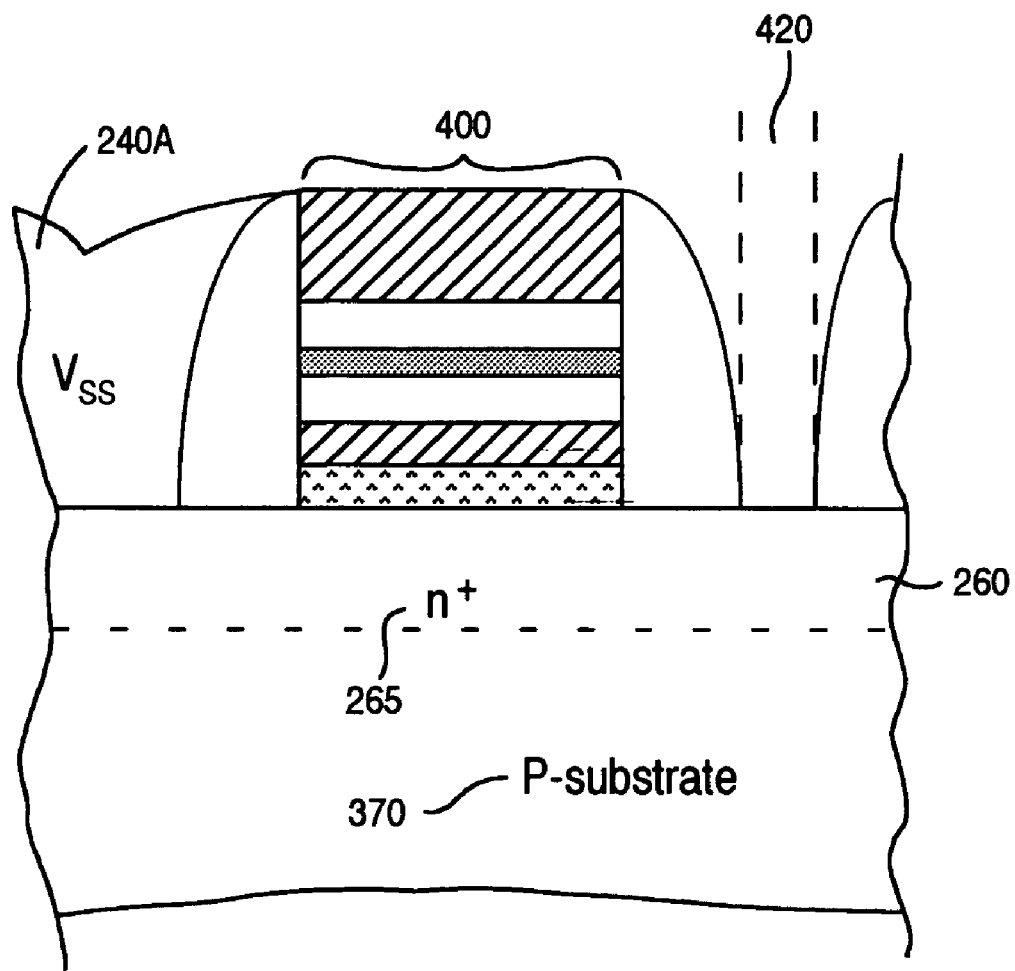
FIG. 4 is a cross sectional view of the core memory array of memory cells (e.g., of FIG. 2 taken along line 2B—2B) illustrating the implantation of n-type dopants in the source column, in accordance with one embodiment of the present invention.

FIG. 4 is a cross sectional diagram of the array 200 of memory cells taken along line 2B—2B of FIG. 2, in accordance with one embodiment of the present invention. FIG. 4 illustrates the formation of a stacked gate structure 400 over the source column 260 designated by the n-type dopants as shown in FIG. 4.

Additionally, FIG. 4 illustrates the formation of a complete stacked gate structure (e.g., including tunnel oxide, floating gate, ONO insulating layer, and control gate) that is formed in the fabrication process of the array 200; however, the stacked gate structure in FIG. 4 is inactive, since there is no formation of isolated source and drain regions. Also, in other embodiments the stacked gate structure may or may not include all the components of the stacked gate structure as shown in FIG. 4 for various fabrication and performance reasons.

Also, FIG. 4 illustrates the source column 260 with the implantation of the n-type dopants (e.g., n⁺ dopants) over a p-type substrate 370, in accordance with one embodiment of the present invention. A Vss line 240A is permanently coupled to the source column 260. In addition, a source contact 420 is formed and coupled to the source column 260, as shown in FIG. 4. The source column 260 provides for electrical coupling between the source contact 420 and the common Vss line 240A.

Figure 5:
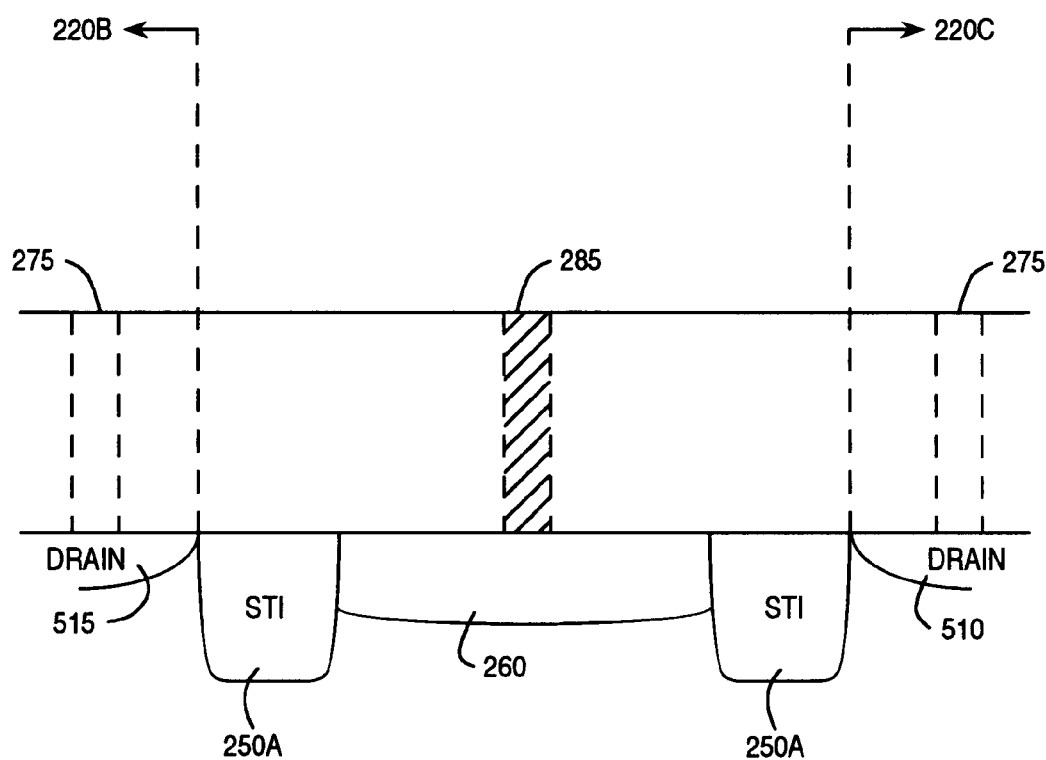
FIG. 5 is cross sectional view of the core memory array of memory cells (e.g., of FIG. 2 taken along line 2C—2C) illustrating the formation of the source contact along a row of drain contacts, in accordance with one embodiment of the present invention.

FIG. 5 is a cross sectional diagram of the array 200 of memory cells taken along line 2C—2C of FIG. 2, in accordance with one embodiment of the present invention. FIG. 5 illustrates the formation of a region 500 in the array 200 of memory cells that spans across three columns (column 220B, 220C and source column 260).

FIG. 5 illustrates the formation of the source contact 285 along the row of drain contacts 270B in the associated row of memory cells 210B. FIG. 5 illustrates an embodiment in which the source contact 285 is of similar dimensions to the drain contacts 275.

In addition, STI regions of the pair 250A of STI regions isolate two columns of memory cells (220B and 220C). Drain regions 510 and 515 are shown of memory cells in the columns 220B and 220C, respectively, of memory cells. A source column 260 is shown isolated between the pair 250A of STI regions.

Exemplary Alternating Vss Interconnections

Figure 6:
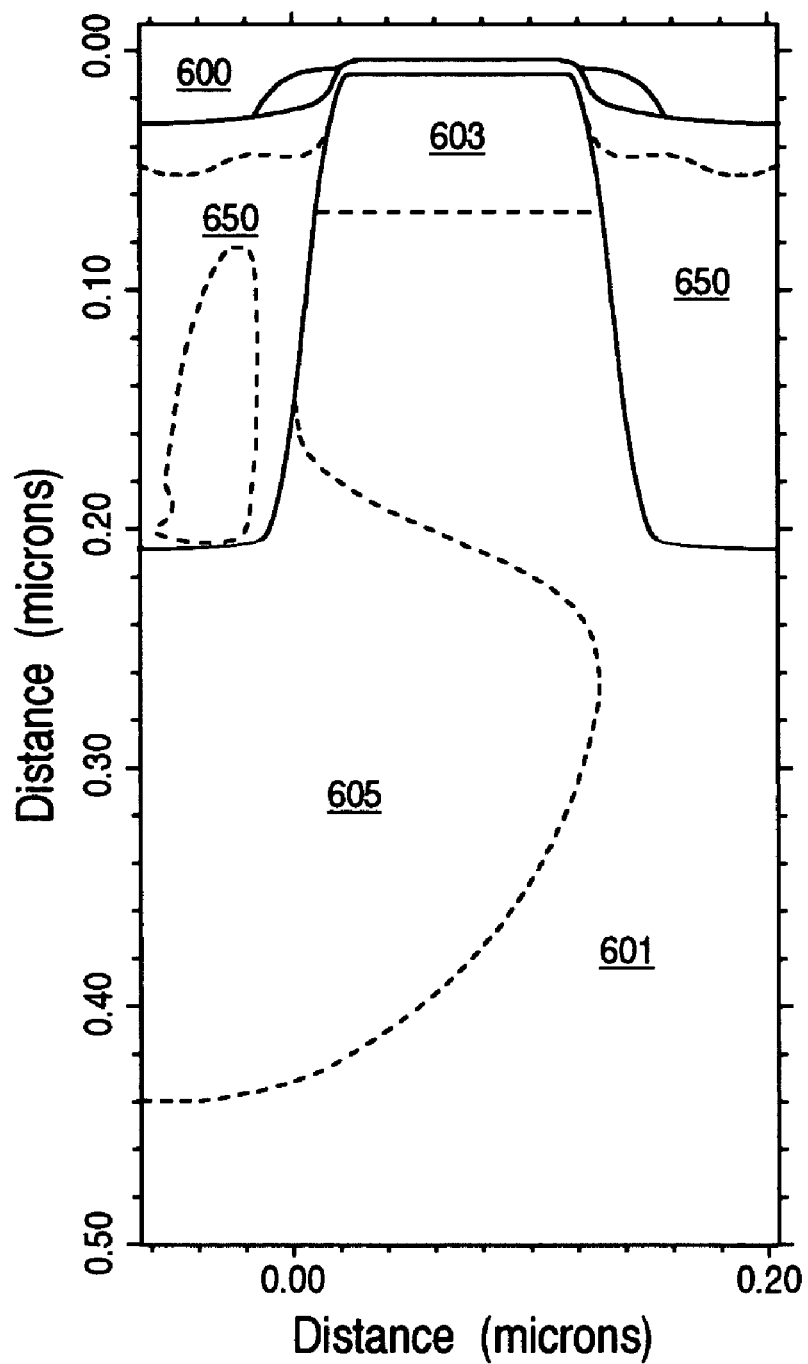
FIG. 6 is a cross sectional view of a section of a memory cell including a drain junction and an implant beneath a single STI area, in accordance with one embodiment of the present invention.

FIG. 6 depicts a cross sectional view of a section 600 of a core memory array of memory cells including a drain junction 603 and two STI areas 650, in accordance with one embodiment of the present invention. An implant comprising n-type dopants has been added to an area proximate to a lower portion of STI region 650 for enhancing conductivity of said Vss lines.

In one embodiment, the area proximate to a lower portion of STI region 650 to which implant is added is beneath one of the STI areas 650. Implant is installed to raise the conductivity of the Vss line 640. The scales shown in FIG. 6 are exemplary only; they are not intended to limit the present embodiment to specific dimensions.

During further fabrication, dopants have diffused out from implant into substrate 601, forming an area of diffusion 605. Diffusion area 605 is of a limited size. It does not reach as far through substrate 601 as to contact the un-implanted STI area 650, nor does it extend far enough up into the channel between the STI regions 650 so as to impact drain junction 603.

Advantageously, the conductivity of the Vss line associated with the implanted STI region 650 is sufficient to prevent excessive IR drop. This advantage is achieved without impacting drain junction 603 and without isolating device 600. Full scalability of memories having Vss interconnections with such alternating implant-augmented conductivities is unimpeded.

In one embodiment, the dopant comprising implant is antimony (Sb). The implant is added at a fairly low energy, such as 20 keV, and at a fairly low dose, such as 4e14, to maximize isolation near the implanted STI 650. This implant energy and dose is exemplary; other implant energies and dosages are used in other embodiments. In one embodiment, arsenic (As) comprises the dopant.

Figure 7:
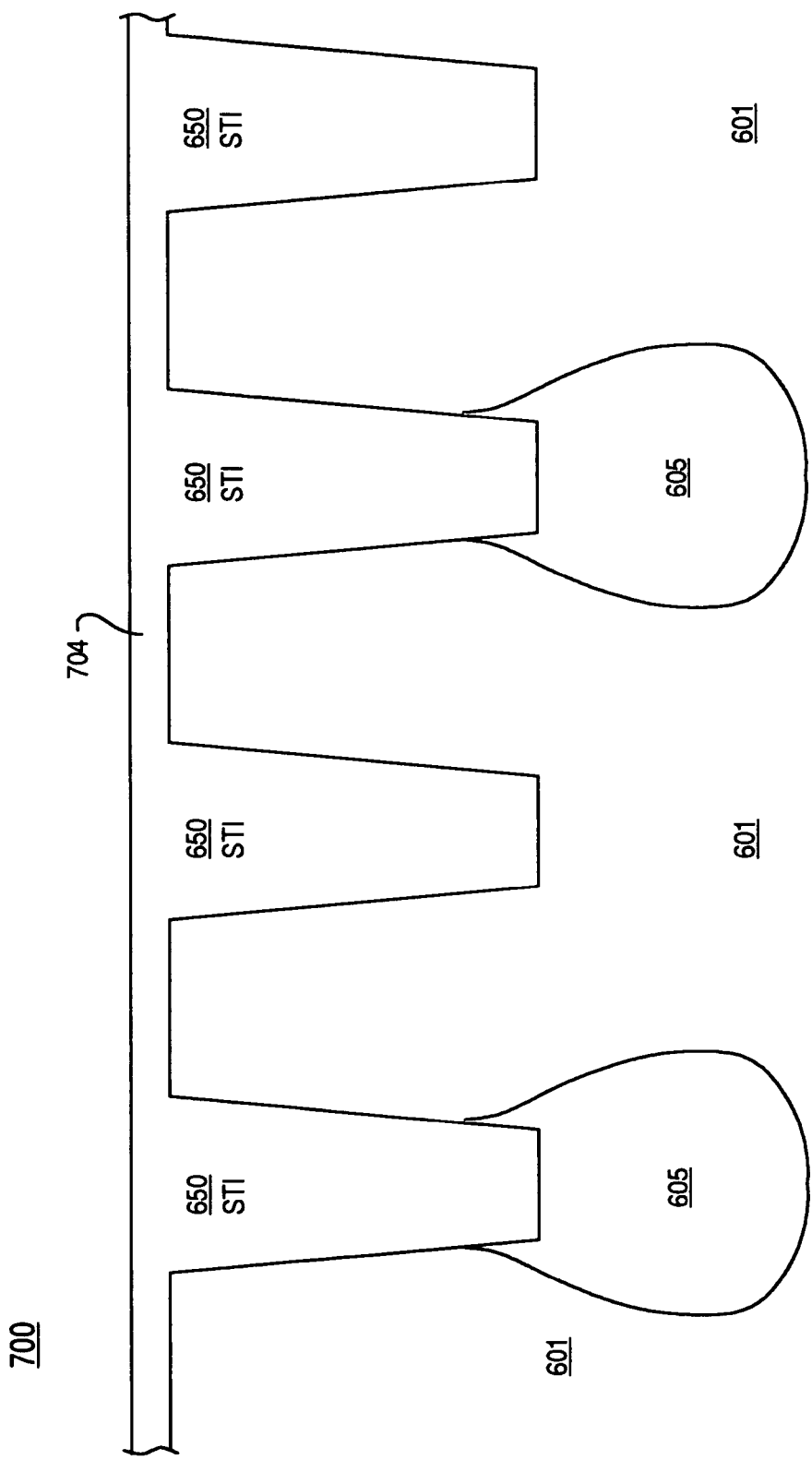
FIG. 7 is a cross sectional view of a section of a core memory array of memory cells including implant beneath alternating STI areas, in accordance with one embodiment of the present invention.

FIG. 7 depicts a cross-sectional view of an array 700 comprising several sections of a core memory array of memory cells, in accordance with one embodiment of the present invention. Diffusion areas 605 form within substrate 601 around each STI area 650 receiving beneath it an implant. However, the diffusion areas 605 do not coalesce or merge. Memory devices formed in region 704 are advantageously not isolated from substrate 601.

Figure 8:
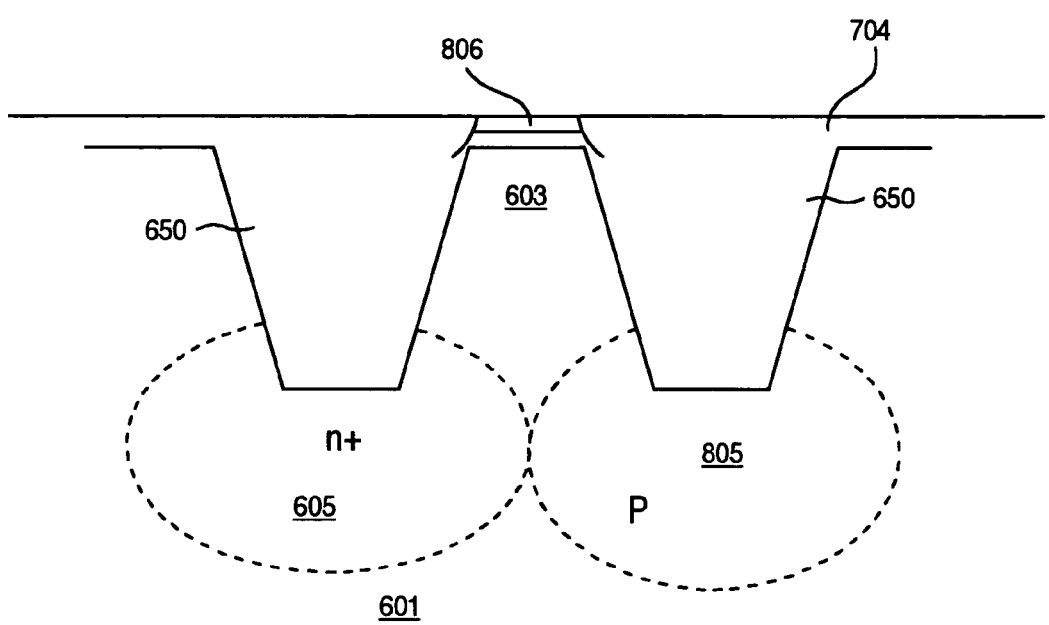
FIG. 8 is a cross sectional view of a section of a core memory array of memory cells including a drain junction and two implant bearing STI areas, one N-doped and one P-doped, in accordance with one embodiment of the present invention.

In one embodiment, a P-type dopant is added beneath the alternate STI areas 650 to provide further insulation from diffusion area 605, while achieving the advantages provided by the alternating Vss interconnection. In FIG. 8, P-type dopant is added as an implant beneath the STI areas 650 which does not receive N-type implant for improvement of the conductivity of the associated Vss line.

N-type implant added beneath one STI area 650, forms a diffusion area 605 in substrate 601 containing N-type dopant. P-type implant beneath the STI area 650 adjacent to the one receiving N-type implant forms a diffusion area 805.

Diffusion area 805 provides further isolation from area 605, such that diffusion area 605 does not encroach the vicinity of the implant 804 bearing STI 650 or drain junction 603.

Advantageously, one embodiment of the present invention provides a medium below the STI region 650 for interconnecting a contact area to the Vss line. The contact is interconnected vertically to the interconnect beneath the STI region 650.

Exemplary Process

Figure 9:
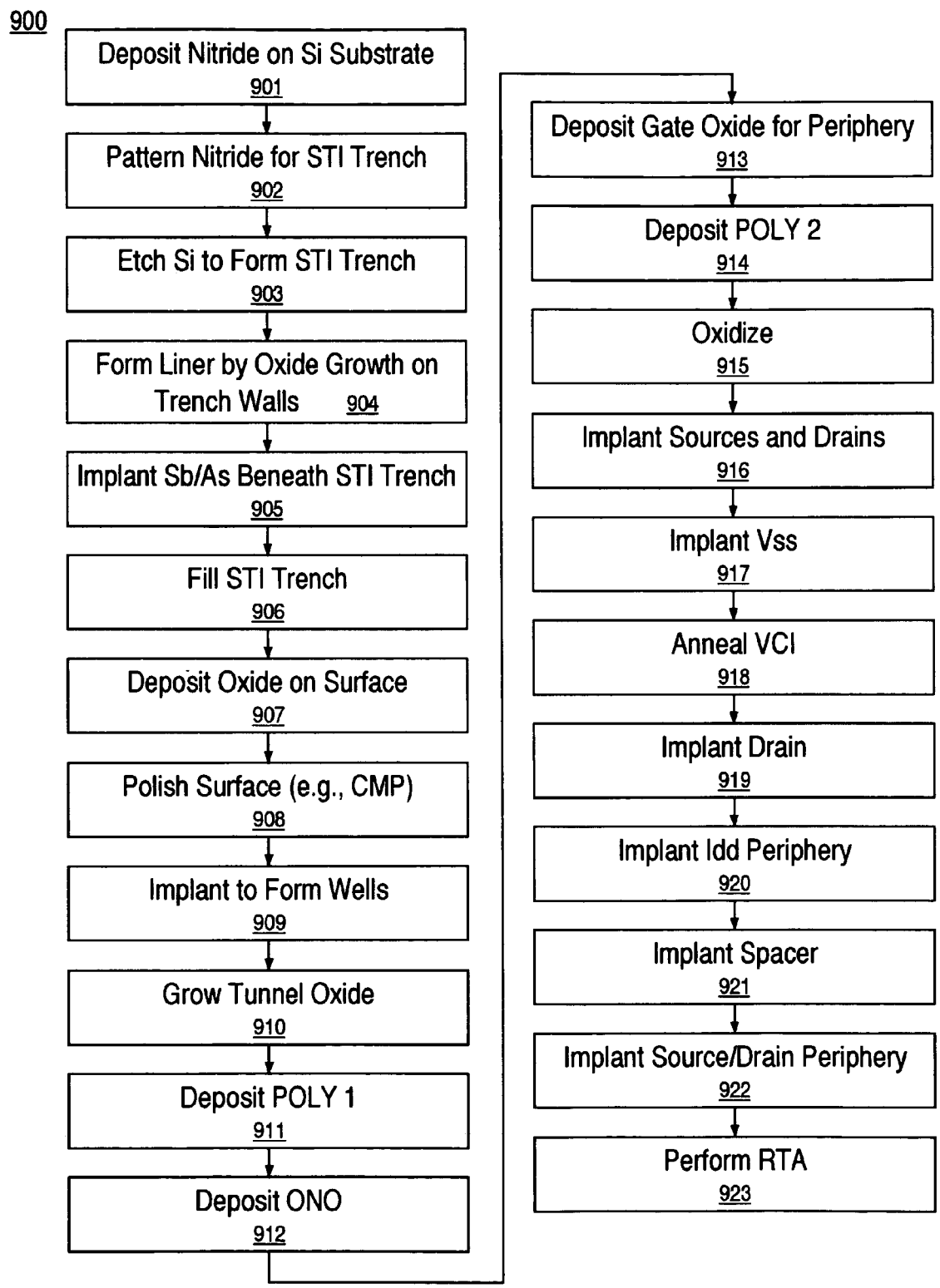
FIG. 9 is a flow chart illustrating steps in a method for the fabricating a memory device including a core array of memory cells with alternating Vss interconnects, in accordance with one embodiment of the present invention.

Alternating Vss interconnections are formed in one embodiment by a novel fabrication process for the memory arrays they comprise. FIG. 9 is a flowchart of such a process 900. Process 900 begins with step 1001, wherein nitride is deposited on a Si substrate. In step 1002, the nitride is patterned for an STI trench. In step 1003, the STI trench is etched.

In step 904, a liner is formed for the STI trench by oxidation, wherein oxide growth is promoted on the trench walls of the STI trenches. In step 905, Sb, As, or another suitable dopant is implanted beneath the STI trench. In another embodiment, this implant is performed prior to liner oxidation (e.g., step 905 precedes step 904). However, this adds a thermal cycle, which would increase diffusion of the dopant into the substrate.

In step 906, the STI trench is filled. In step 907, oxide is deposited upon the surface of the substrate. This surface is polished in step 908. Polishing, in one embodiment, comprises chemical mechanical polishing (CMP).

In step 909, implants are added to form wells. In step 910, tunnel oxide is grown. In step 911, a first polycrystalline Si layer (POLY) (e.g., POLY 1) is deposited. An oxide-nitride-oxide (ONO) layer is deposited in step 912 above the POLY 1 layer. In step 913, gate oxide is deposited for device periphery. In step 914, a second POLY layer (e.g., POLY 2) is deposited.

In step 915, oxidation is performed. In step 916, sources and drains are implanted. Vss lines are implanted in step 917. In step 918, the VCI is annealed. In step 919, drains are implanted. In step 920, the lightly doped drain (Idd) periphery is implanted. Spacers are implanted in step 921. In step 922, the source and drain peripheries are implanted. In step 923, rapid thermal annealing (RTA) is performed upon execution of which, process 900 is complete.

An embodiment of the present invention, a semiconductor memory device having an alternating Vss interconnection, and a method for producing the same, is thus described. While the present invention has been described in particular embodiments, it should be appreciated that the present invention should not be construed as limited by such embodiments, but rather construed according to the below claims.

What is claimed is:

1. A semiconductor memory device comprising an array of memory cells arranged in rows and columns, wherein said array of memory cells comprises:
   a plurality of non-intersecting shallow trench isolation (STI) regions isolating a plurality of said columns of memory cells;
   a plurality of common source (Vss) lines coupled to a source column arranged according to said columns that are coupled to a plurality of source regions in said array of memory cells; and
   an area proximate to a lower portion of non-adjacent said STI regions implanted with n-type dopants for enhancing conductivity of said Vss lines.

2. The semiconductor memory device as recited in claim 1 wherein said source column is implanted with n-type dopants isolated between an adjoining pair of said plurality of non-intersecting STI regions.

3. The semiconductor memory device as recited in claim 1 wherein said non-adjacent said STI regions comprise alternating said STI regions.

4. The semiconductor memory device as recited in claim 3 wherein said n-type dopants for enhancing conductivity of said Vss lines comprise an alternating Vss interconnection.

5. The semiconductor memory device as described in claim 1, wherein said n-type dopants are selected from the group consisting of antimony and arsenic.

6. The semiconductor memory device as described in claim 1, wherein said area proximate to a lower portion of non-adjacent said STI regions comprises a region beneath said STI region.

7. The semiconductor memory device as described in claim 1, wherein diffusion of said n-type dopants for enhancing conductivity of said Vss lines into a substrate further comprising said array does not reach an adjacent said STI region.

8. The semiconductor memory device as described in claim 1, wherein said n-type dopants for enhancing conductivity of said Vss lines are implanted at low energy.

9. The semiconductor memory device as described in claim 1, wherein said n-type dopants for enhancing conductivity of said Vss lines are implanted at low dosage.

10. A non-volatile semiconductor memory device comprising an array of memory cells arranged in rows and columns, wherein said array of memory cells comprises:
    a plurality of non-intersecting shallow trench isolation (STI) regions isolating a plurality of said columns of memory cells;
    a plurality of common source (Vss) lines coupled to a source column arranged according to said columns that are coupled to a plurality of source regions in said array of memory cells; and
    an area proximate to a lower portion of non-adjacent said STI regions implanted with n-type dopants for enhancing conductivity of said Vss lines.

11. The non-volatile semiconductor memory device as recited in claim 10 wherein said source column is implanted with n-type dopants isolated between an adjoining pair of said plurality of non-intersecting STI regions.

12. The non-volatile semiconductor memory device as recited in claim 10 wherein said non-adjacent said STI regions comprise alternating said STI regions.

13. The non-volatile semiconductor memory device as recited in claim 10 wherein said n-type dopants for enhancing conductivity of said Vss lines comprise an alternating Vss interconnection.

14. The non-volatile semiconductor memory device as described in claim 10, wherein said n-type dopants are taken from a group consisting of antimony and arsenic.

15. The non-volatile semiconductor memory device as described in claim 10, wherein said area proximate to a lower portion of non-adjacent said STI regions comprises a region beneath said STI region.

16. The non-volatile semiconductor memory device as described in claim 10, wherein diffusion of said n-type dopants for enhancing conductivity of said Vss lines into a substrate further comprising said array does not reach an adjacent said STI region.

17. The non-volatile semiconductor memory device as described in claim 10, wherein said n-type dopants for enhancing conductivity of said Vss lines are implanted at low energy and low dosage.

* * * * *